United States Patent
Schreiner et al.

(10) Patent No.: US 7,309,397 B2
(45) Date of Patent: Dec. 18, 2007

(54) PROCESS FOR THE MANUFACTURE OF PIEZOCERAMIC MULTILAYER ACTUATORS

(75) Inventors: Hans-Jürgen Schreiner, Neunkirchen am Sand-Rollhofen (DE); Reiner Bindig, Binlach (DE); Matthias Simmerl, Henfenfeld (DE); Jürgen Schmidt, Marktredwitz (DE)

(73) Assignee: Ceramtec AG Innovative Ceramic Engineering, Plochingen (DE)

( * ) Notice: Subject to any disclaimer, the term of this patent is extended or adjusted under 35 U.S.C. 154(b) by 0 days.

(21) Appl. No.: 10/755,129

(22) Filed: Jan. 9, 2004

(65) Prior Publication Data

US 2004/0139588 A1  Jul. 22, 2004

Related U.S. Application Data

(62) Division of application No. 10/079,946, filed on Feb. 20, 2002, now abandoned.

(30) Foreign Application Priority Data

Feb. 21, 2001  (DE) ................. 101 08 314
Feb. 12, 2002  (DE) ................. 102 05 928

(51) Int. Cl.
 *C03B 29/00* (2006.01)
 *B32B 38/04* (2006.01)
 *B32B 38/10* (2006.01)
 *H01L 41/00* (2006.01)

(52) U.S. Cl. ............... 156/89.12; 156/89.16; 156/154; 156/252; 156/253; 310/311; 310/368; 310/369

(58) Field of Classification Search ............ 156/89.12, 156/89.16, 89.23, 153, 154, 155, 250, 252, 156/253, 267, 293; 310/311, 331, 358; 29/25.35
See application file for complete search history.

(56) References Cited

U.S. PATENT DOCUMENTS

| | | | | |
|---|---|---|---|---|
| 3,456,313 A | * | 7/1969 | Rodriguez et al. | 29/25.42 |
| 3,920,781 A | * | 11/1975 | Eror et al. | 264/615 |
| 4,806,295 A | * | 2/1989 | Trickett et al. | 156/89.22 |
| 4,994,703 A | * | 2/1991 | Oguri et al. | 310/363 |
| 5,164,920 A | * | 11/1992 | Bast et al. | 367/140 |
| 5,568,679 A | * | 10/1996 | Ohya et al. | 29/25.35 |
| 5,680,685 A | * | 10/1997 | Bischoff | 29/25.42 |
| 5,758,395 A | * | 6/1998 | Lenzen et al. | 28/191 |
| 6,045,893 A | * | 4/2000 | Fukushima et al. | 428/209 |
| 6,230,378 B1 | * | 5/2001 | Cramer et al. | 29/25.35 |
| 6,333,589 B1 | * | 12/2001 | Inoi et al. | 310/358 |
| 6,384,517 B1 | * | 5/2002 | Kojima et al. | 310/358 |
| 6,731,050 B2 | * | 5/2004 | Bindig et al. | 310/366 |
| 6,922,005 B2 | * | 7/2005 | Schreiner | 310/328 |

(Continued)

FOREIGN PATENT DOCUMENTS

JP  60-64212  *  4/1985

(Continued)

*Primary Examiner*—Melvin Mayes
(74) *Attorney, Agent, or Firm*—Fulbright & Jaworski L.L.P.

(57) ABSTRACT

A block of stacked green films provided with internal electrodes is laminated, at least one actuator is separated from the block, the actuator obtains its shape by means of a machining operation, is then sintered, and the sinter skin produced by the sintering is used as an insulating layer. The sinter skin is abraded at the points where the internal electrodes are connected to the external electrodes.

15 Claims, 1 Drawing Sheet

U.S. PATENT DOCUMENTS

2002/0195903 A1 * 12/2002 Schreiner .................. 310/331

FOREIGN PATENT DOCUMENTS

| JP | 61-142780 | * | 6/1986 |
| JP | 63-72171 | * | 4/1988 |
| JP | 6-77086 | * | 3/1994 |
| JP | 9-148640 | * | 6/1997 |
| JP | 2000-228340 | * | 8/2000 |
| JP | 2001-23862 | * | 1/2001 |

* cited by examiner

PROCESS FOR THE MANUFACTURE OF PIEZOCERAMIC MULTILAYER ACTUATORS

This application is a divisional application of U.S. Ser. No. 10/079,946 filed Feb. 20, 2002 now abandoned.

BACKGROUND AND SUMMARY OF THE INVENTION

The invention concerns a process for the manufacture of piezoceramic multilayer actuators.

A piezoceramic multilayer actuator 1 is shown schematically in FIG. 1. The actuator consists of stacked thin layers 2 of piezoelectrically active material, for example lead zirconate titanate (PZT), with conductive internal electrodes 3, which are led out alternately to the surface of the actuator, disposed between said layers. External electrodes 4, 5 interconnect the internal electrodes 3. As a result, the internal electrodes 3 are electrically connected in parallel and combined into two groups. The two external electrodes 4, 5 are the connecting poles of the actuator 1. They are connected via the connections 6 to a voltage source, not shown here. If an electrical voltage is applied via the connections 6 to the external electrodes 4, 5, this electrical voltage is transmitted in parallel to all internal electrodes 3 and produces an electric field in all layers 2 of the active material, which is consequently mechanically deformed. The sum of all of these mechanical deformations is available at the end faces of the head region 7 and the foot region 8 of the actuator 1 as a useable expansion 9 and/or force.

Piezoceramic multilayer actuators are fabricated according to the prior art as monoliths, that is to say the active material onto which internal electrodes are deposited by a silk screen process prior to sintering, is disposed as a so-called green film in successive layers as a stack that is compressed into a green body. The compression of the green body is usually carried out by lamination under the action of pressure and temperature in laminating moulds. Depending on the lamination tool used, this process determines to a large extent the external shape of the actuators. The laminate is separated into several actuators, which are pyrolized and then sintered. Since lamination in the unsintered body often produces non-homogeneity in the density, and the shrinkage during the firing of the ceramic is not of a constant value, the final required geometry of the actuators can only be accurately obtained by the hardening of the sintered actuators. However, in this case the internal electrode layers deposited in the actuators are thereby also processed. If the processed surfaces are not subsequently electrically insulated, then when these piezoceramic multilayer actuators are actively operated, there is a risk of an electrical flashover at the actuator surface because the dielectric field strength in air, which amounts to approximately 1000 V/mm, is exceeded by the operating field strengths of over 2000 V/mm. At the same time the smearing of the electrodes caused by the hardening additionally leads to reduced dielectric strength and/or leakage currents.

The object of the present invention is to present a process that simplifies the manufacture of multilayer actuators and by which the demonstrated disadvantages are avoided.

This object is achieved according to the present invention.

By stacking green films made of piezoceramic material, which are printed with the corresponding patterns of the internal electrodes for at least one piezoceramic multilayer actuator and by corresponding lamination under pressure of around 100 bar at a temperature of approximately 120° C., a green body is obtained with high mechanical strength, good adhesion between film layers, good mechanical machinability and homogeneous density. According to the invention, it is therefore possible to easily detach the multilayer actuators from such a green body as a laminate and subsequently by machining to yield their shape, which is usually already the final shape, so that after sintering the actuators require no further finishing. The insulating sinter skin needs only to be removed at the connecting faces where the internal electrodes have to be connected to the respective external electrode, for example by grinding. Due to the high mechanical strength of the laminate blocks, all machining operations, such as turning, milling, sawing, drilling or grinding are possible. In this case the bodies are neither damaged nor deformed. Due to the lower hardness of the material compared to the sintered state, tool wear is considerably reduced, thus making low-cost production possible.

Due to sintering, a so-called sinter skin forms all over the surface of the piezoceramic multilayer actuator, which sinter skin has such a high electrical insulating capability, even in the region where the internal electrodes emerge at the surface of the actuator, that subsequent insulation of the surfaces of the piezoceramic multilayer actuator can usually be omitted.

The sinter skin is thus abraded at the points where the internal electrodes are connected to the external electrodes.

Through suitable choice and/or combination of machining methods, the good machinability of the laminate enables piezoceramic multilayer actuators to be manufactured with different shapes. The cross-sectional areas can be circular, elliptical, square or polygonal. All edges of the green bodies can be broken, chamfered or rounded off prior to sintering. The ease of machining of the ceramic material in the green phase also enables rotationally symmetric mouldings to be produced.

The laminated block with the at least one multilayer actuator has a high strength and a high dimensional stability. It is thus possible, prior to sintering, to place several boreholes or pocket holes in the block and/or the unsintered piezoceramic multilayer actuator, which can additionally be provided with a thread. Such an arrangement can be advantageous for subsequent applications, such as fixings or connections. Since the layers of the internal electrodes are penetrated by the boreholes or pocket holes as well as by the machine-cut thread, in this case the sinter skin produced by sintering can also be advantageously used as an insulating layer.

A further option for shaping the multilayer actuators consists in punching holes of the required size, shape and number in the green films in the same operating cycle, prior to lamination, in which the green films are suitably punched out for the laminating mould. The green films with the printed internal electrodes thereon are then stacked one on top of the other in the required number and arrangement, so that the boreholes or pocket holes are produced in the desired arrangement and depth. Here again, threads can be machine-cut in the holes following lamination.

To increase stability and to maintain dimensional accuracy, the boreholes, through-holes or pocket holes can be filled prior to lamination with a filler which prevents any plastic deformation of the recesses which otherwise may occur during lamination. This filler is chosen so that under lamination conditions it is not more plastic or-cannot be deformed to a greater degree than the piezoceramic material of the green films.

A filler may consist of a hard, dimensionally stable and, during lamination, thermally stable material, for example metal or ceramic. According to the shaping, pins or threaded pins can be inserted into the boreholes or pocket holes.

Furthermore, plastic or thermoplastic fillers, in particular a highly-flexible rubber or-rubber-like plastic, are suitable. Here too the filler can have the form of a pin or threaded pin.

Following lamination, the pins or threaded pins are withdrawn or unscrewed from the laminate.

Fillers which remain dimensionally stable up to the lamination temperature are also suitable. During lamination or sintering these fillers smelt or pyrolize. For example, wax or low-melting-point polymers can be removed from the laminate by heating. A suitable organic material can also be used as a filler, such as is known from the prior art for forming porous ceramics, for example carbon black or a polymer that pyrolizes without residues during lamination or sintering at temperatures up to 700° C.

The thermal removal may also be achieved by melting out and/or thermal decomposition in a thermal process preceding sintering, for example an appropriate debonding process.

The invention is explained in further detail with the aid of an exemplifying embodiment in which:

DETAILED DESCRIPTION

Figure 1:
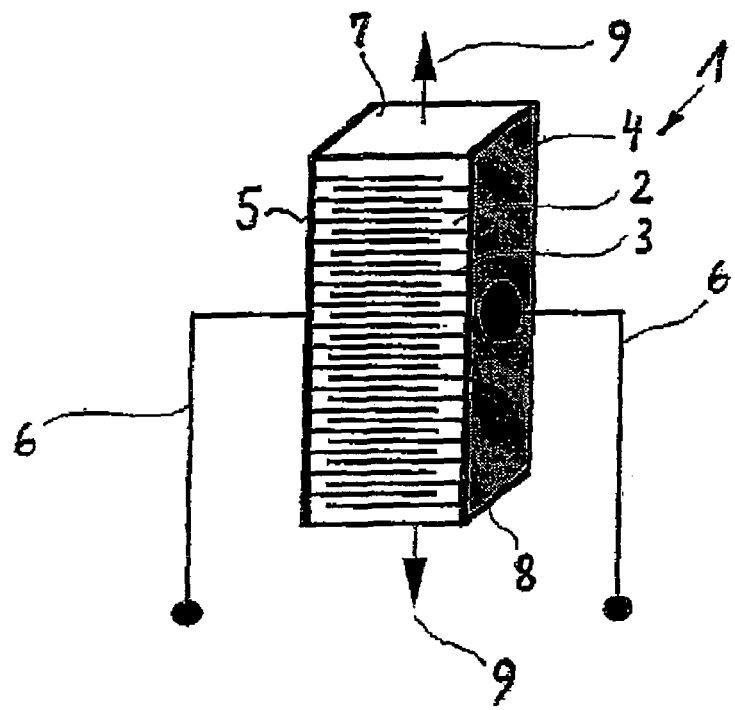
FIG. 1 is a schematic of a piezoceramic multilayer actuator.
Figure 2:
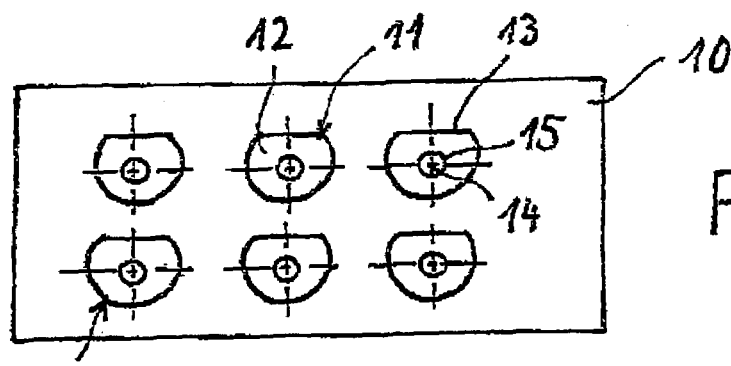
FIG. 2 shows a green film with several internal electrodes.

FIG. 2 shows a green film 10 made of piezoceramic material already punched out for the laminating mould. Six internal electrodes 11 are each placed on this green film, this application usually being achieved by the silk screen process. The assignment of several internal electrodes to one green film allows the efficient manufacture of several multilayer actuators at the same time. On one side of the circular cross-sectional area 12, a circular section is cut out so that the area is limited by a secant 13. A hole 15 is punched out concentrically to the mid-point 14.

The required numbers of green films are stacked one above the other to form a block, so that the internal electrodes lie one above the other. The number of films depends on the size of the multilayer actuator. In the present exemplifying embodiment, the block has six multilayer actuators. Due to the ease of separation, following lamination, the multilayer actuators, still in the green state, are separated from each other around the internal electrodes. Likewise still in the green state, the final machining of the multilayer actuators can then take place until the specified basic diameter of the multilayer actuator is obtained. Only after this are the multilayer actuators sintered.

The arrangement of the internal electrodes 11 on the green film 10 always has the same orientation. These are internal electrodes of the same polarity. The internal electrodes of the opposite polarity can be fabricated in the same way. In this case, however, their orientation is opposite to the orientation of the internal electrodes of opposite polarity assigned to them, that is to say rotated by 180 degrees on the subsequent green film. The electrode layers with the opposite polarity therefore alternate. In a block which shows the contour of a multilayer actuator, the holes 15 lying one above the other form a continuous recess.

Figure 3:
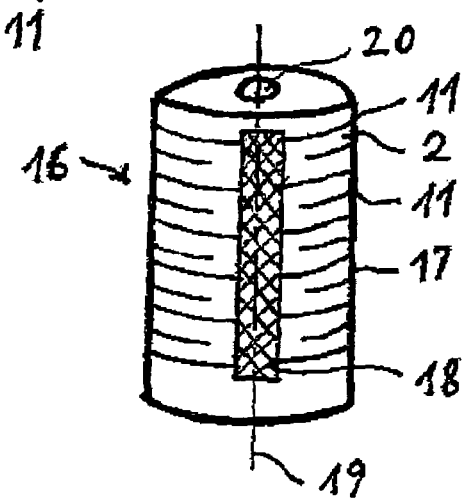
FIG. 3 shows a multilayer actuator manufactured according to the process according to the invention.

A multilayer actuator 16 that has been manufactured according to the process according to the invention is shown in a schematic, much enlarged representation in FIG. 3. It has a circular cross-section 12 and is fully coated by a sinter skin 17. The internal electrodes 11 of the same polarity are fully exposed on the peripheral face, whereas in the case of the internal electrodes of opposite polarity the circumference is broken because of the missing circular section. This design is advantageously utilised to connect the internal electrodes of the same polarity to the respective external electrode 18, at the opposite sides of the multilayer actuator where the internal electrodes of the same polarity can now be seen at the periphery. The sinter skin 17 is removed in this region by grinding, and the internal electrodes 11 are exposed at their peripheral face. A continuous recess 20, formed from the holes 15 lying one above the other in the green films 10, which can be used for fixing purposes, runs concentrically to the axis 19 of the multilayer actuator 16.

The invention claimed is:

1. A process for manufacturing piezoelectric multilayer actuators comprising the steps of:
   stacking a plurality of green films one above the other to form a block, wherein each of said green films comprises an inner electrode and a piezoelectric material, such that the inner electrodes are led out alternately at opposing faces of the actuator;
   laminating said block under pressure and with the application of heat to form a laminated block;
   separating a plurality of actuators from said laminated block to form a plurality of separated actuators;
   shaping the plurality of separated actuators;
   sintering the plurality of separated actuators to form a sinter skin which is an insulating layer on said separated actuators; and
   abrading said sinter skin at points where the internal electrodes are to be connected to an external electrode to interconnect the inner electrodes and to form the piezoelectric multilayer actuators, wherein prior to lamination, holes of the required size, shape and number are punched in the green films and the green films provided with the internal electrodes are then stacked one on top of the other in the required number and arrangement, so that boreholes or pocket holes are produced in a desired arrangement and depth, and wherein a thread is machine-cut in the boreholes or in the pocket holes, respectively.

2. The process according to claim 1, comprising filling the borehole or the pocket holes with a filler prior to lamination.

3. The process according to claim 2, wherein a hard, dimensionally stable and, during lamination, thermally stable material, is the filler.

4. The process according to claim 2, wherein said filler comprises metal or ceramic.

5. The process according to claim 2, wherein said filler is a plastic or thermoplastic material.

6. The process according to claim 2, wherein said filler is a highly-flexible rubber or a plastic.

7. The process according to claim 2, wherein said filler remains dimensionally stable approximately up to an elimination temperature and is thermally removed.

8. The process according to claim 7, wherein said filler is a wax or a low-melting-point polymer, wherein said filler smelts during lamination or sintering.

9. The process according to claim 7, wherein said filler is an organic material that pyrolizes without residues during lamination or sintering.

10. The process according to claim 7, wherein thermal removal is achieved by at least one of smelting and thermal decomposition in a thermal process preceding sintering.

11. A process for manufacturing piezoelectric multilayer actuators comprising the steps of:
  stacking a plurality of green films one above the other to form a block, wherein each of said green films comprises an inner electrode and a piezoelectric material, such that the inner electrodes are led out alternately at opposing faces of the actuator;
  laminating said block under pressure and with the application of heat to form a laminated block;
  separating a plurality of actuators from said laminated block to form a plurality of separated actuators;
  shaping the plurality of separated actuators;
  sintering the plurality of separated actuators to form a sinter skin which is an insulating layer on said separated actuators;
  abrading said sinter skin at points where the inner electrodes are to be connected to an external electrode to interconnect the inner electrodes and to form the piezoelectric multilayer actuators, wherein prior to lamination, holes of the required size, shape and number are punched in the green films and the green films provided with the internal electrodes are then stacked one on top of the other in the required number and arrangement, so that boreholes or pocket holes are produced in a desired arrangement and depth, wherein the borehole or the pocket holes are filled with a filler prior to lamination wherein said filler is used in the form of pins or threaded pins, wherein following lamination, the pins or threaded pins are withdrawn or unscrewed from the laminate.

12. A process for manufacturing piezoelectric multilayer actuators comprising the steps of:
  stacking a plurality of green films one above the other to form a block, wherein each of said green films comprises an inner electrode and a piezoelectric material, such that the inner electrodes are led out alternately at opposing faces of the actuator;
  laminating said block under pressure and with the application of heat to form a laminated block;
  separating a plurality of actuators from said laminated block to form a plurality of separated actuators;
  shaping the plurality of separated actuators;
  sintering the plurality of separated actuators to form a sinter skin which is an insulating layer on said separated actuators; and
  abrading said sinter skin at points where the internal electrodes are to be connected to an external electrode to interconnect the inner electrodes and to form the piezoelectric multilayer actuators wherein a thread is provided in a pocket hole or a borehole of the actuator; and wherein the shaping is performed by machining with machinery tools.

13. A method for manufacturing piezoelectric multilayer actuators, comprising the steps of:
  applying inner electrodes to a piezo-ceramic material green films to form green sheets;
  stacking the green films to form a block such that the inner electrodes are carried alternately on opposing faces of the actuator where they are to be connected with one another through an outer electrode,
  introducing boreholes or pocket holes into the block, wherein prior to stacking, the green films have holes punched in the green films so that upon stacking, boreholes or pocket holes are produced in a desired arrangement and depth in the block;
  laminating the block under pressure and with the application of heat to form a laminated block;
  separating a plurality of actuators from the laminated block to form a plurality of separated actuators;
  shaping the plurality of separated actuators to a desired form;
  sintering the actuators to form a sinter skin thereon, wherein the sinter skin is an insulating layer; and
  removing said sinter skin only at points on the opposing faces to expose the inner electrodes such that the sinter skin is left on the opposing faces except where the inner electrodes are to be connected to outer electrodes;
  wherein prior to lamination, the boreholes or the pocket holes in the actuators are filled with a filler which, under the conditions of lamination, is not more plastic than or cannot be deformed to a greater degree that the piezo-ceramic material of the green films material of the green sheets in order to increase the stability and maintain dimensional accuracy of the actuator and to prevent the plastic deformation of boreholes or pocket holes during lamination.

14. The process according to claim 13, wherein the boreholes or pocket holes are introduced in the required size, shape and number into the green films and wherein the green films are stacked one on top of the other in a required number.

15. The process according to claim 13, wherein the boreholes or pocket holes are a desired shape.

* * * * *